(12) United States Patent
Wong

(10) Patent No.: US 9,369,174 B2
(45) Date of Patent: Jun. 14, 2016

(54) DIFFERENTIATOR BASED SPREAD SPECTRUM MODULATOR

(71) Applicant: TEXAS INSTRUMENTS INCORPORATED, Dallas, TX (US)

(72) Inventor: Kern Wai Wong, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/922,016

(22) Filed: Oct. 23, 2015

(65) Prior Publication Data

US 2016/0043769 A1 Feb. 11, 2016

Related U.S. Application Data

(63) Continuation of application No. 14/253,544, filed on Apr. 15, 2014, now abandoned.

(51) Int. Cl.
*H03L 7/06* (2006.01)
*H04B 1/7087* (2011.01)
*H04B 1/7156* (2011.01)

(52) U.S. Cl.
CPC ............ *H04B 1/7087* (2013.01); *H04B 1/7156* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,001,725 A * | 3/1991 | Senderowicz | ...... | H04L 25/0274 341/143 |
| 6,975,148 B2 * | 12/2005 | Miyata | ................... | H03C 3/095 327/156 |
| 7,095,260 B2 * | 8/2006 | Miyata | ................... | H03C 3/095 327/156 |
| 7,323,916 B1 * | 1/2008 | Sidiropoulos | ........... | H03L 7/081 327/147 |
| 7,432,750 B1 * | 10/2008 | Sidiropoulos | ........... | H03L 7/081 327/105 |
| 7,443,215 B1 * | 10/2008 | Sidiropoulos | ........... | H03L 7/081 327/107 |
| 7,620,094 B2 * | 11/2009 | Yoneda | ................. | H03L 7/0805 342/150 |
| 8,085,101 B2 * | 12/2011 | Yamamoto | .............. | H03L 7/087 327/156 |
| 8,160,193 B2 * | 4/2012 | Yoneda | ................. | H03L 7/0805 327/141 |
| 2004/0136440 A1 * | 7/2004 | Miyata | ................... | H03C 3/095 375/130 |
| 2005/0285641 A1 * | 12/2005 | Miyata | ................... | H03C 3/095 327/156 |
| 2006/0244499 A1 * | 11/2006 | Miyata | ................... | H03C 3/095 327/156 |
| 2006/0267647 A1 * | 11/2006 | Chang | ....................... | H03L 7/16 327/156 |
| 2007/0236375 A1 * | 10/2007 | Andre | .................... | H03M 3/464 341/143 |
| 2007/0285076 A1 * | 12/2007 | Dequina | ................... | G05F 1/46 323/316 |
| 2011/0057693 A1 * | 3/2011 | Huang | ................. | H03K 5/1565 327/156 |
| 2011/0156782 A1 * | 6/2011 | Huang | ................... | G06F 1/022 327/159 |
| 2012/0201338 A1 * | 8/2012 | Leung | ................. | H03C 3/0941 375/376 |
| 2013/0082611 A1 * | 4/2013 | Cohen | ............... | H05B 33/0815 315/185 R |
| 2013/0093478 A1 * | 4/2013 | Wong | ................... | H03L 7/0995 327/156 |

* cited by examiner

*Primary Examiner* — Adam Houston
(74) *Attorney, Agent, or Firm* — Andrew Viger; Frank D. Cimino

(57) ABSTRACT

A spread spectrum clock generator which includes a pulse train generator circuit and a modulating circuit configured to produce a modulating signal relating to a time derivative of an output of the pulse train generator circuit. In one embodiment the modulating circuit includes a active differentiator circuit and in another embodiment the modulating circuit includes a passive differentiator circuit. A modulator is included which is configured to produce a spread spectrum clock output which is frequency modulated by the modulating signal.

18 Claims, 6 Drawing Sheets

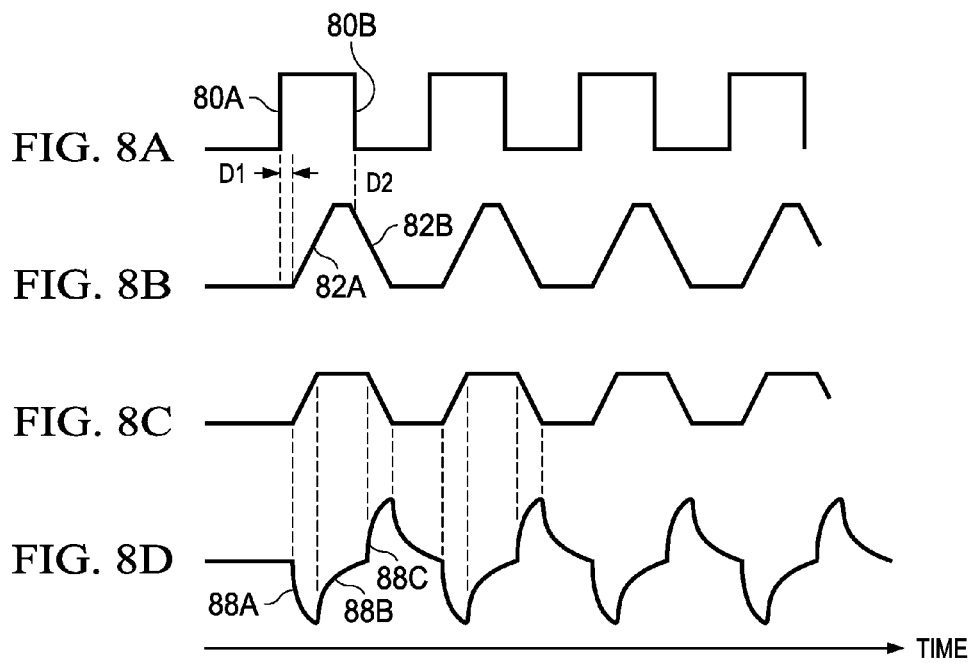
FIG. 8A
FIG. 8B
FIG. 8C
FIG. 8D
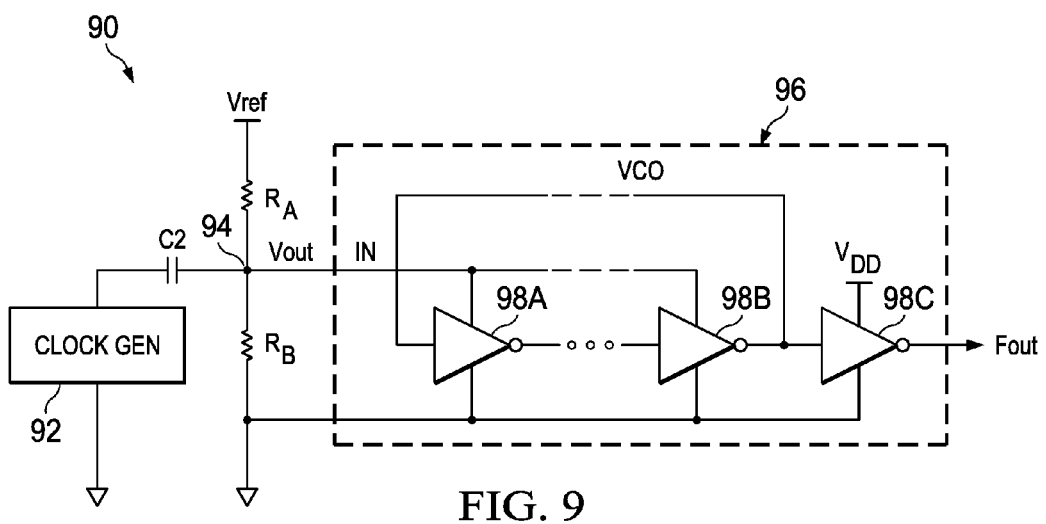
FIG. 9 ced clock is spread over a relatively wide frequency band having a much lower peak output. The difference in magnitudes in this case is 11 dB which represents a very substantial reduction in EMI. In this case, the modulation waveform is a linear signal, so that during a given modulation period, the frequency is changed in a linear manner between a value equal to the center frequency plus a fixed percentage and a value equal to the center frequency minus a fixed percentage. In the ideal case, the amplitude of the spread spectrum signal is a some-

DIFFERENTIATOR BASED SPREAD SPECTRUM MODULATOR

BACKGROUND OF THE INVENTION

1. Field of the Invention

The present invention relates generally to signal modulators and in particular to spread spectrum modulators for use in clock generators.

2. Description of Related Art

Many electronic devices include some kind of stable clocking circuitry for producing clock signals which allow the devices to operate internally and to co-operate with other devices. The use of highly stable clocks frequently results in electromagnetic interference (EMI). As a result, regulatory agencies such as the Federal Communication Commission (FCC) have established regulations limiting EMI radiation. One approach is to provide shielding and the like, but this approach increases costs and weight. Another approach to reducing EMI emissions is to dynamically vary the clock frequency so as to spread the interference energy over a range of frequencies so as to limit the energy at any one frequency. The approach is known as spread spectrum frequency modulation.

At this point, a brief review of some of the relevant terminology may be helpful. In a typical spread spectrum system, the average system clock frequency (frequency $f_c$) is dithered to some degree, with the peak frequency deviation ($\Delta f$) being expressed as free or ±%. The spreading rate ($\delta$) is defined as the range of spreading frequency over the native system clock frequency ($\Delta f/f_c$). The actual spreading rate $\delta$ style can be center-spreading where the frequency deviation $\Delta f$ is centered around $f_c$ ($\delta = \pm \Delta f/2f_c \times 100\%$); down-spreading where the frequency deviation $\Delta f$ extends from $f_c$ to a lower frequency ($\delta = -\Delta f/f_c \times 100\%$) and up-spreading where the frequency deviation $\Delta f$ extends from $f_c$ to a higher frequency ($\delta = +\Delta f/f_c \times 100\%$). The modulation rate ($f_m$) is the frequency used to determine the system clock frequency spreading-cycling rate. Thus, $1/f_m$ is the period or time during which the clock frequency varies through $\Delta f$ and returns to the original native frequency. The modulation index ($\beta$) is equal to $\Delta f/f_m$ and, finally, the phrase modulation waveform refers to the profile of the clock frequency variation curve as a function of time, with a simple example of a modulation waveform being a saw tooth ramp.

Referring to the drawings, FIG. 1 shows the output frequency spectrum of a non-modulated clock centered at 2 MHz together with the spectrum of a modulated clock centered at near the same frequency but produced using spread spectrum frequency modulation. The modulation waveform is a linear waveform in this case. The center frequency $f_c$ for the modulated clock is 2 MHz and the modulation rate $f_m$ is 12 kHz. The peak frequency deviation $\Delta f$ is ±100 kHz or ±5%. The modulation index $\beta$ is $\Delta f/f_m = 8.3$, and the spreading rate $\delta$ is 5. In this example, the spreading style is up-spreading.

As can be seen form FIG. 1, the non-modulated clock produces a relatively high level output concentrated in a narrow frequency range whereas the energy of the modulated clock is spread over a relatively wide frequency band having a much lower peak output. The difference in magnitudes in this case is 11 dB which represents a very substantial reduction in EMI. In this case, the modulation waveform is a linear signal, so that during a given modulation period, the frequency is changed in a linear manner between a value equal to the center frequency plus a fixed percentage and a value equal to the center frequency minus a fixed percentage. In the ideal case, the amplitude of the spread spectrum signal is a somewhat trapezoidal shape having a relatively flat top region indicating that the spectral energy is evenly distributed. In an actual implementation, there will be peaks in the output at various frequencies which tend to reduce the effectiveness of the spread spectrum modulation in reducing EMI.

FIG. 2 show a simplified block diagram of a prior art spread spectrum clock generator. The clock generator includes phase comparator circuit 10 which compares the phase of a reference clock input Fin and a generated clock Fd. The output of the phase comparator 10 is an Up signal and a down signal Dn, with the relative duration of the two signals relating to the phase difference between Fin and Fd. Signals Up and Dn drive a charge pump circuit 12 that sources an output current when signal Up is active and sinks an equal value output current when signal Dn is active. When signals Up and Dn are of equal duration over time, the average output current is zero thereby indicating that inputs Fin and Fd are in phase. A phase difference is indicated by a net current being sourced over time or a net current being sunk over time. The current output CPO of the charge pump circuit 12 is fed to a low pass filter 14 that provides an output voltage Vc relating to the phase difference between Fin and Fd. Control voltage Vc is fed to a spread spectrum modulator 16 which varies the magnitude of Vc is accordance with a spread spectrum modulating profile Mod applied to an input to the modulator.

The output Vc' of the modulator 16 is applied to the control input of a voltage controlled oscillator (VCO) 18. The frequency of VCO is divided down by an optional divider 20 so that the frequency of Fd matches that of Fin. The modulation waveform Mod applied to the modulator 16 causes Vc' to vary so that the control signal Vc' applied to VCO 18 causes Fout to be spread spectrum modulated. Although the FIG. 1 spectrum was produced using a linear modulating profile, other types of profiles can be used. By way of example, FIG. 3 shows the frequency spectrum of an un-modulated clock signal 22 and a spectrum modulated clock signal 24 produced using a sinusoidal modulation waveform. Although there is improved performance on the order of 13 dB over the unmodulated clock, it can be seen that the improvement is limited by the presence of spectrum peaks 26A and 26B. The peaks are produced as a result of the presence of substantial zero slope regions in the sinusoidal modulating profile so that the frequency deviation is momentarily absent thereby resulting in the spikes.

FIG. 4 is an alternative prior art modulation waveform 25 that provides substantially improved performance. It can be seen in this example that the modulating period ($1/f_m$) is about 33 μs, which corresponds to a modulating rate of 30 kHz. In this example, the peak frequency deviation $\Delta f$ is ±100 kHz, with the center spreading style being used. As described in U.S. Pat. No. 5,631,920, the contents of which are fully incorporated herein by reference, FIG. 5 illustrates a clock generator circuit which is capable of producing and utilizing the FIG. 4 profile using digital circuitry. Among other things, a counter 30 operates to provide a frequency divided output Fin of a reference oscillator 28 to an up/down counter 32. Counter 32 produces addresses used to access a read only memory (ROM) 34 where digital data are stored for producing the FIG. 4 profile. The read data is converted to analog signals by converter 36, with the analog signal on line 44 being provided to an adder circuit 38. A second input to adder circuit 38 on line 46 is produced by phase locked loop circuitry associated with the input clock Fin. The sum of the two analog signals is used to control a VCO 40 which produces the spread spectrum modulated clock Fout. The center frequency of Fout is controlled by the phase locked loop output on line 46, with the frequency deviation be provided by the signal on line 44.

ROM 34 of the FIG. 5 digitally based clock generator along with other circuitry allows the circuit to be programmed to provide substantial flexibility in producing and modifying the FIG. 4 modulation waveform. Although this results in enhanced performance, this performance is achieved at the expense of circuit complexity and power consumption.

There is a need for a spread spectrum clock generator that provides relatively high performance and yet can be implemented utilizing relatively simple analog circuitry while providing reduced power consumption.

BRIEF DESCRIPTION OF THE DRAWINGS

FIGS. 8A-8D are various waveforms produced by the FIG. 7A modulating circuitry, including FIG. 8D which shows one exemplary modulation waveform.

FIG. 9 is a simplified circuit diagram of a second embodiment of the present invention.

DETAILED DESCRIPTION OF THE INVENTION

Figure 1:
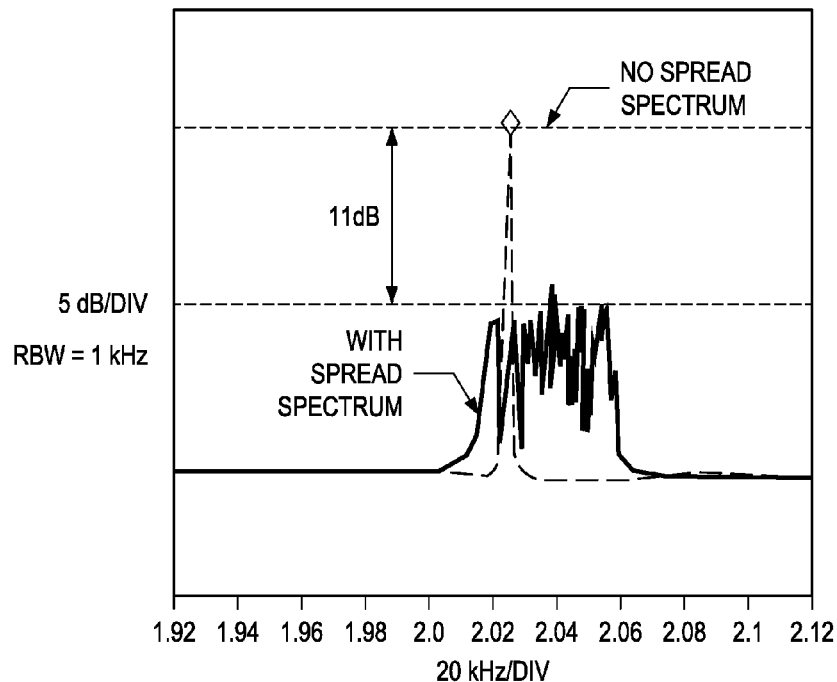
FIG. 1 shows the frequency spectrum of an ordinary clock signal and of a spread spectrum modulated clock signal, with the modulated clock signal being produced by a prior art clock generation circuitry using a linear modulation waveform.
Figure 2:
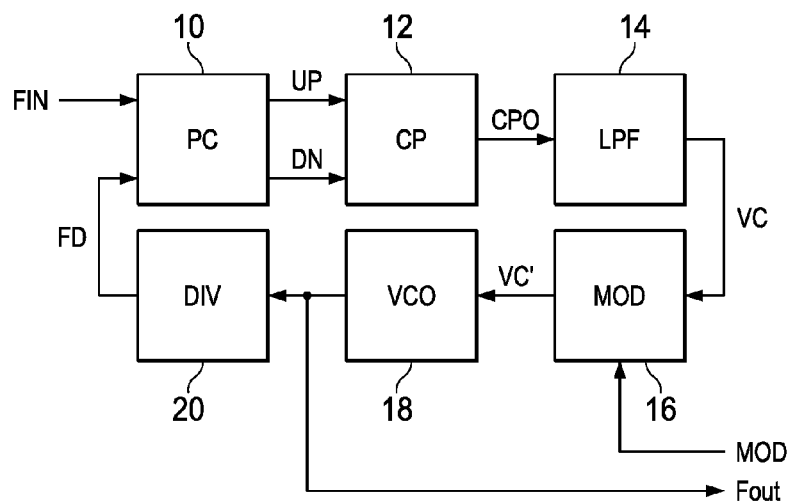
FIG. 2 is a simplified block diagram of one exemplary prior art spread spectrum clock generator circuit.
Figure 3:
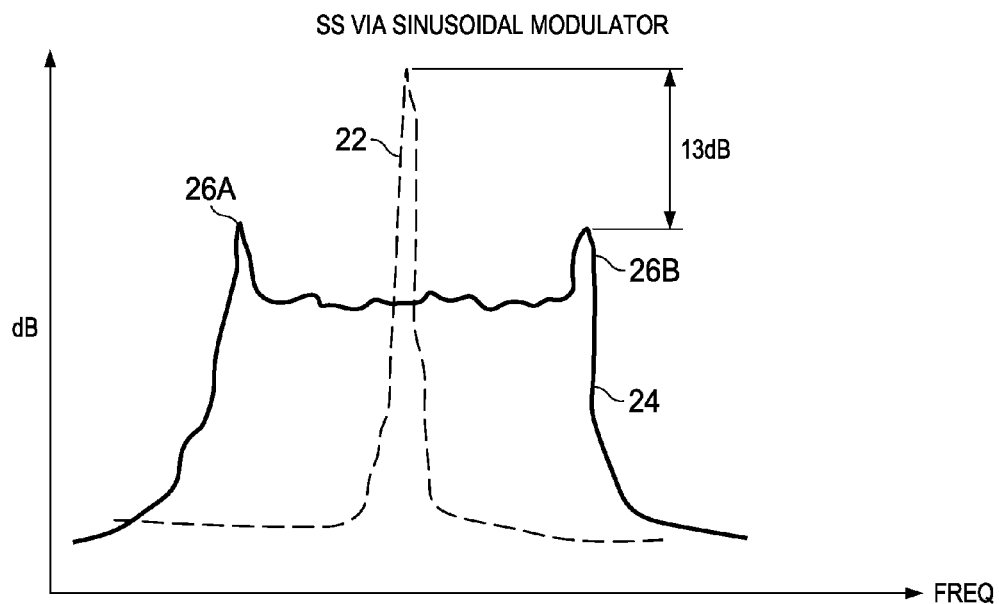
FIG. 3 is shows the frequency spectrum of an ordinary clock signal and a spread spectrum modulated clock signal using a prior art sinusoidal modulation waveform.
Figure 4:
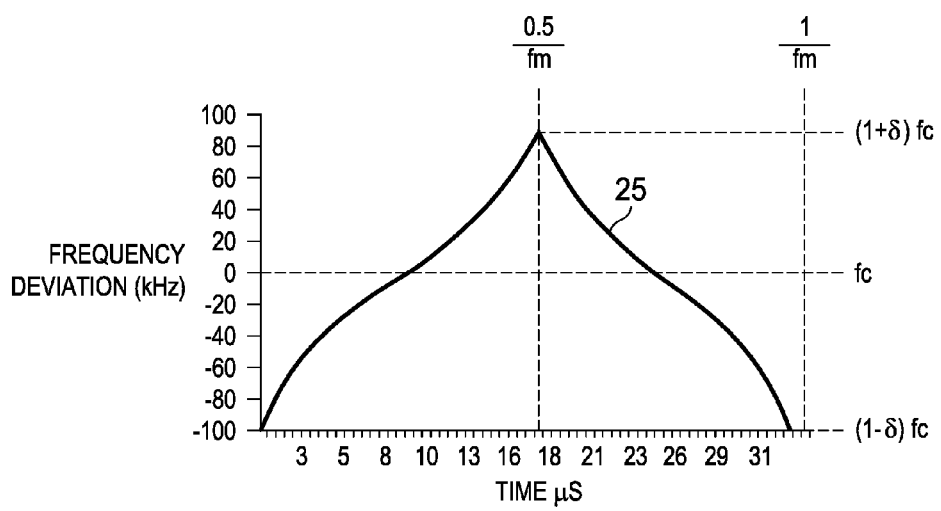
FIG. 4 is another prior art modulation waveform used for producing spread spectrum clocks.
Figure 5:
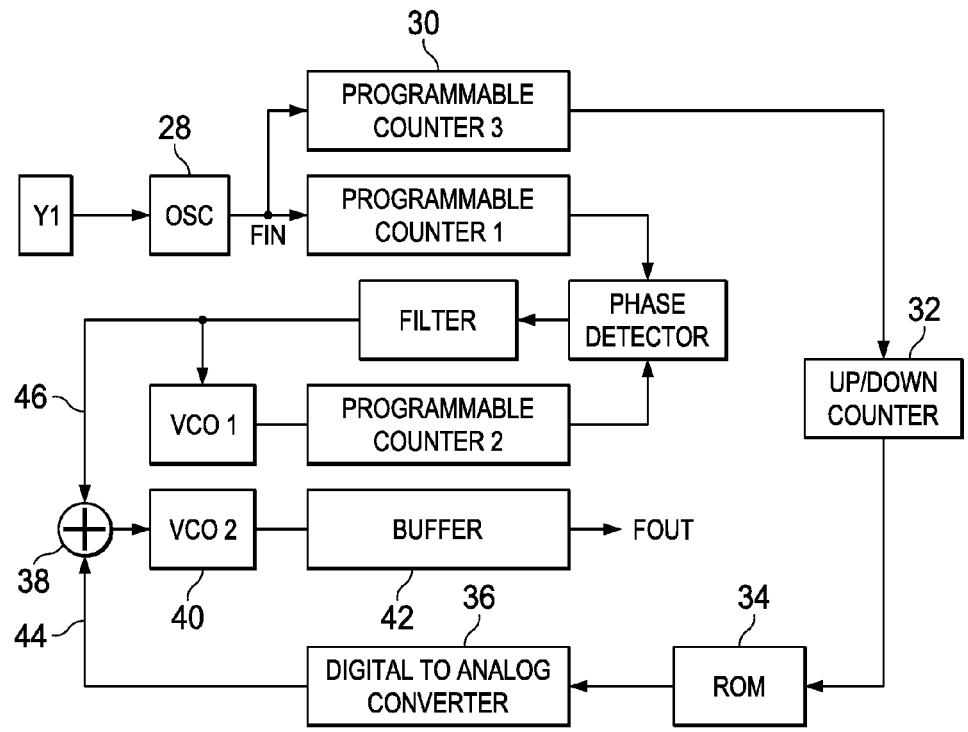
FIG. 5 is a prior art spread spectrum clock generating circuit which is capable of producing the modulation waveform of FIG. 4.
Figure 6:
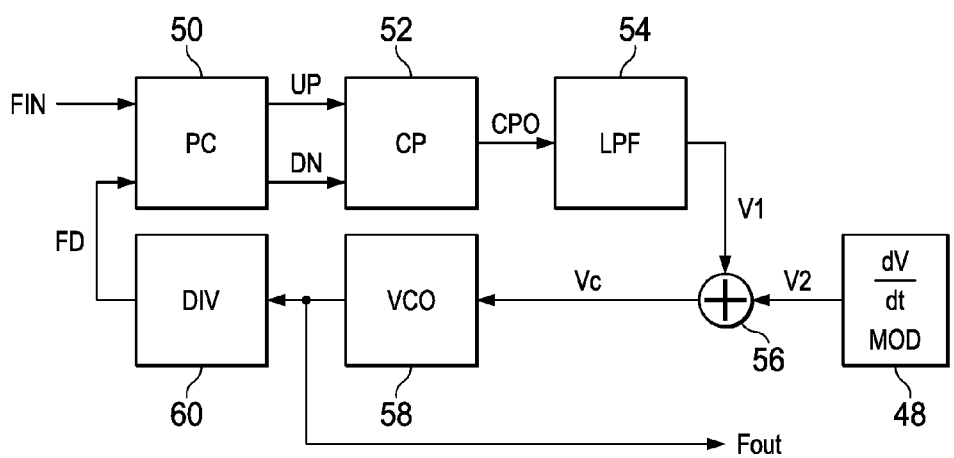
FIG. 6 is a spread spectrum clock generating circuit in accordance with one embodiment of the present invention which incorporates analog differentiating circuitry.

Referring again to the drawings, FIG. 6 shows a spread spectrum clock generator in accordance with one embodiment of the present invention. An input or reference clock Fin is provided to one input of a phase detector circuit 50, with a frequency divided version Fd of the modulated clock output Fout being supplied to the other detector input. Divider 60, which can be adjusted to provide differing frequencies of Fout, can be eliminated. As in the case of the FIG. 2 clock generator, the output of the phase comparator 50 is an up signal Up and a down signal Dn, with the relative duration of the two signals relating to the phase difference between Fin and Fd. Signals Up and Dn drive a charge pump circuit 12 that sources an output current when signal Up is active and sinks an equal value output current when signal Dn is active. When signals Up and Dn are of equal duration over time, the average output current is zero thereby indicating that Fin and Fd are in phase. A phase difference is indicated by a net current being sourced over time or a net current being sunk over time. The current output CPO of the charge pump circuit 12 is fed to a low pass filter 14 that provides an output voltage V1 relating to the phase difference between Fin and Fd. A principle component of filter 54 is a capacitor which is either charged by current sourced by the charge pump circuit 52 or discharged by current sunk by the charge pump circuit.

A differentiator based modulating circuit 48 provides a modulating output V2 which is combined by summing circuit 56 with the output V1 of the low pass filter 54 to produce a third output Vc. Vc constitutes a control signal that is applied to the control input of a voltage controlled oscillator (VCO) 58. VCO 58 provides an output having a frequency/phase determined by the magnitude of the control signal input. The output of VCO 58 forms the output. Fout of the clock generator and is also divided down by divider 60 to provide the feedback input Fd to the phase detector 50. The relatively low frequency output V1 operates to set the center frequency of VCO 58, with the modulator 48 output V2 being at a somewhat higher frequency which operates to modulate output V1 to produce control signal Vc. Thus, clock output Fout has a center frequency set by V1 and is frequency modulated by V2, with Fout being a spread spectrum modulated clock.

Figure 7A:
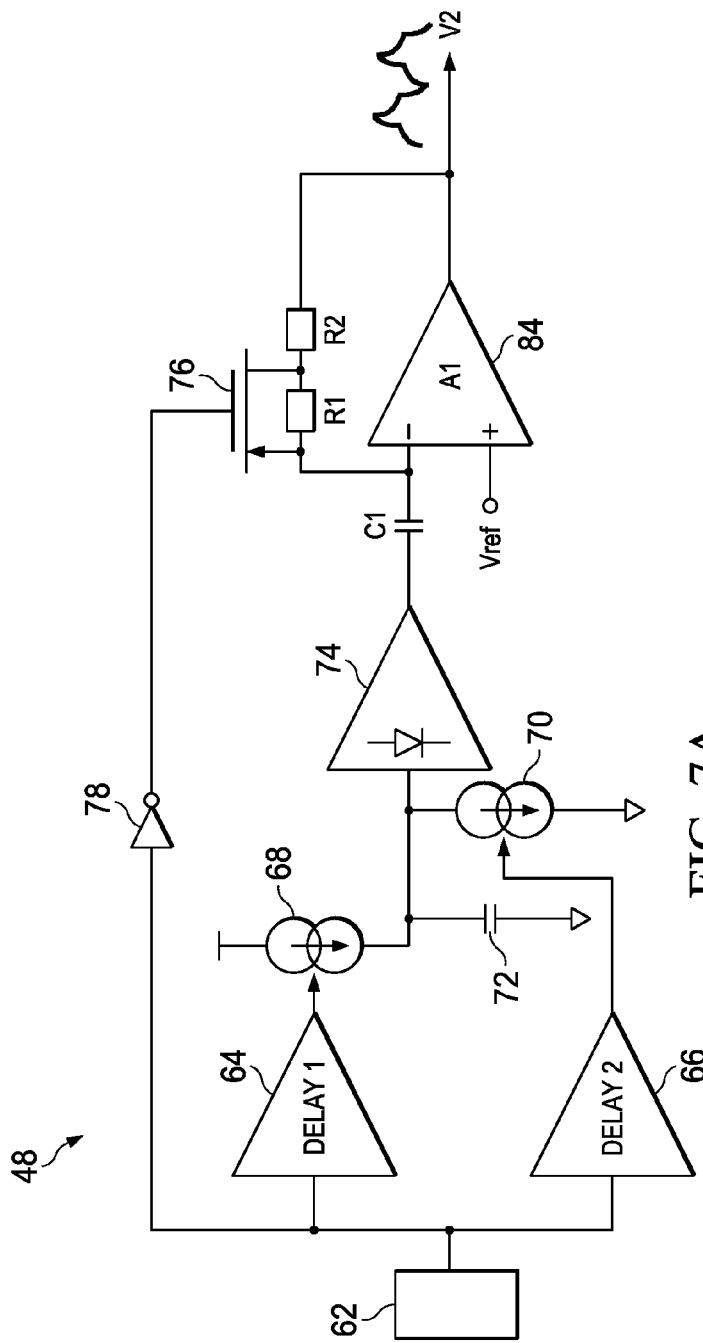
FIG. 7A is modulating circuitry, using an active analog differentiator, for use the FIG. 6 embodiment of the present invention.

The details of one embodiment of the differentiating modulator 48 of FIG. 6 are shown in FIG. 7A. A pulse generator circuit 62 is included which produces a pulse train as depicted in the FIG. 8A timing diagram. Pulse shaping circuitry is provided which permits the rise and fall times of the pulses to he independently adjusted to produce the pulse train of FIG. 8B. The pulse shaping circuitry includes a first delay circuit 64 which is triggered by the rising edge 80A of the pulses in the pulse train. After a delay D1, a current source 68 is triggered to an ON state so as to charge a capacitor 72. The voltage across capacitor 72 increases linearly, with the slope being determined by the magnitude of the current and the capacitance. Thus, the slope of the rising edge 82A of the shaped pulses can be set to various desired levels. The pulse shaping circuitry further includes a second delay circuit 66 which is triggered by the falling edge 80B of the pulses in the pulse train. After a delay D2 (which is set to zero in this example) a second current source 70 is activated which causes capacitor 72 to be discharged at a controlled rate depending upon the magnitudes of the current and capacitance. Thus, the slope of the falling edge 82B of the shaped pulses can also be set to various desired levels. A limiter circuit 74 is provided in the shaping circuitry for limiting the magnitude of the shaped pulses to a desired level as shown in FIG. 8C.

The shaped pulses of FIG. 8C are provided to the input of an active differentiator circuit 84. The differentiator circuit includes an operational amplifier A1 having a resistive feedback path connected between the output and the inverting input. The non-inverting input is connected to a voltage Vref. The resistive feedback path includes series connected resistors R1 and R2. A P type MOS transistor 76 is connected across resistor R1 so that resistor R1 can be reduced to a relatively small resistance when transistor 76 is turned ON. An inverting gate driver circuit 78 operates to turn transistor 76 ON when the pulses (FIG. 8A) out of generator 62 are high. A capacitor C1 is connected between the limiter circuit 74 and the inverting input of amplifier A1. As is well known, the amplifier A1 and associated circuitry form an op amp differentiator having the an output voltage $v_O(t)$ as follows:

$$v_O(t) = -R_F C_1 [dv_I(t)/dt] \tag{1}$$

where
$v_O(t)$ is the output,
$R_F$ is the feedback resistance which changes in value depending upon the state of transistor 76;

$C_1$ is the input capacitance; and $dv_I(t)/dt$ is the time derivative of the input applied to capacitor $C_1$.

The output voltage $v_O(t)$ has a DC component set at Vref. The value $-R_F C_1$ is referred to as the differentiator gain or time constant.

One exemplary output V2 of the differentiator circuit, the sum of $v_O(t)$+Vref, is shown in FIG. 8D. Output V2 can function, by way of example, as the modulation waveform V2 of the FIG. 6 spread spectrum clock generator. The exact shape of the V2 waveform can be adjusted by altering the characteristics of the pulse waveform 8C applied to the differentiator circuit and by altering the characteristics of the differentiator circuit itself. The wave shape characteristics of the pulse waveform can be varied by adjusting the FIG. 8A pulse train waveform, the magnitudes of delays D1/D2 and the rise/fall times set by currents 68/70 and capacitance 72. The characteristics of the differentiator can be controlled by varying $C_1$ and $R_F$, with $R_F$ being determined by the sum of resistances R1 and R2 when transistor 76 is OFF and only R2 when transistor 76 is ON assuming that R2 is much larger than the ON resistance of the transistor. Thus, the differentiator gain of $-R_F C_1$ can be altered by controlling transistor 76 in response to the state of the clock pulse train of FIG. 8A so that the gain is one value when the pulse train is in a first state and another value when the pulse train is in the opposite state.

As can be seen, the FIG. 7A circuitry for producing the modulation waveform of FIG. 8D can provide four relatively independent degrees of freedom. In this manner the respective shapes of the four waveform sections 88A, 88B, 88C and 88D can be independently controlled to a large degree. It has been found that a satisfactory approach for selecting a particular modulation waveform shape relies upon empirical methods. Well known circuit simulation software can be used to generate various waveform shapes and those shapes can then be tested using other types of modeling to determine, among other things, the resultant reduction of EMI for a particular application.

Figure 7B:
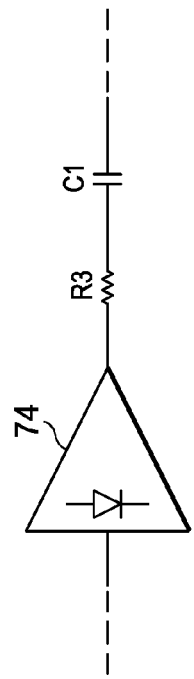
FIG. 7B shows a modification of the modulating circuitry of FIG. 7A.

The input impedance of the FIG. 7A differentiator looks like capacitor C1 connected to ground and thus can become small for high frequency signals, thereby resulting in large current flow through capacitor C1. It would be possible to modify the circuit by inserting a resistor R3 as shown in FIG. 7B between limiter 74 and capacitor C1. The resultant transfer function is in the form of a differentiator multiplied by the transfer function of a low pass filter having a pole time constant at R3*C1. The resultant circuit acts as a differentiator for frequencies well below 1/(R3*C1) and also maintain the reasonably high input impedance for high frequency signals.

A second embodiment spread spectrum clock generator 90 is depicted in FIG. 9. This embodiment utilizes passive, rather than active, differentiation circuitry. The differentiation circuitry includes an input capacitor C2 connected to a node 94 which forms the junction between resistors RA and RB. As will be described, node 94 is connected to the control input In of a voltage controlled oscillator 96. Ignoring any loading of the differentiator circuit by VCO 96, it can be seen from an AC perspective that the current flow $I_C$ through capacitor C2 is equal to Vin/($R_P$+Zc) where Vin is the input voltage pulses produced by clock generator 92, $R_P$ is the parallel combination of RA and RB and Zc is the impedance of capacitor C2. Current $I_C$ is approximately equal to Vin/Zc if it is assumed that $R_P$ is much smaller than Zc, that is, $R_P$ is much smaller than 1/($\omega$C2) or $\omega$<<1/($R_P$*C2). With this assumption, substantially the entire input voltage Vin is dropped across capacitor C2 so that the current flow $I_C$ through capacitor C2 is approximately C2(dVin/dt). Thus, the AC output voltage at node 94, voltage Vo(t), can be expressed as follows:

$Vo(t)=I_C*R_P$ or $Vo(t) \approx C2(dVin/dt)*R_P$     (2)

assuming $\omega >> 1/(R_P*C2)$

The DC voltage at node 94, Vdc, is equal to Vref(RB)/(RB+RA) so that the composite voltage Vout based upon superposition is as follows:

$Vout \approx Vdc+Vo(t)$ or $Vout \approx Vref(RB)/(RB+RA)+C2*R_P(dVin/dt)$     (3)

As previously noted, signal Vout is applied to the control input In of a VCO 96. In the present exemplary embodiment, VCO 96 is based upon a ring oscillator which includes an odd number of inverting stages 98A to 98B. The output of stage 98B is connected back to the input of stage 98A so as to provide a positive feedback path which results in oscillation. The frequency of oscillation is inversely related to the total propagation delay of each stage, with the delay being controlled by the way of the control input In. Low values of input In result in reduced current to each stage thereby increasing the propagation delay of the stages and hence producing a lower frequency of oscillation. Conversely, a higher value of input In results in a larger current to the stages thereby reducing the delay and increasing the frequency. An output buffer stage 98C buffers the output of the ring oscillator to produce the output Fout.

The center frequency $f_c$ of oscillation of VCO 96 is determined by the DC voltage component of equation (3), namely Vdc=Vref*RB/(RB+RA). The frequency deviation from the center frequency is determined by the AC component of equation (3), namely Vo(t)$\approx$C2*$R_P$(dVin/dt). Thus, the output of VCO 96, clock Fout comprises a spread spectrum modulated signal. The frequency modulating signal is Vo(t) can be modified by altering the characteristics of the passive differentiator circuit and the characteristics of the pulse train produced by clock generator 92 so as to provide a modulating signal similar to that depicted in FIG. 8D.

Figure 10A:
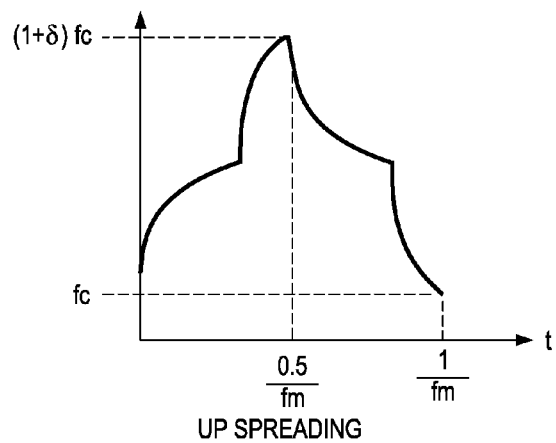
FIGS. 10A-10C show examples of the FIG. 8D modulation waveform implementing three frequency spreading styles including up-spreading, center-spreading and down-spreading respectively.
Figure 10B:
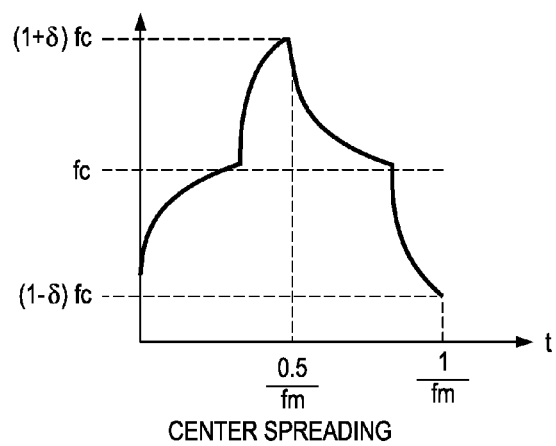
Figure 10C:
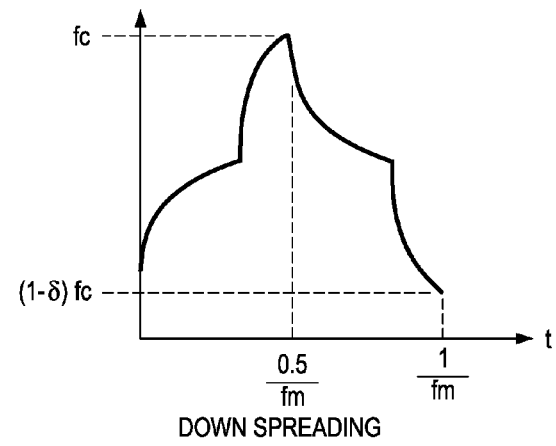

FIGS. 10A, 10B and 10C show how exemplary modulation waveforms produced using the FIG. 7A/7B and FIG. 9 circuitry can be utilized in the various spectrum spreading styles. FIG. 10A shows the up-spreading approach where the frequency deviation $\Delta f$ is between $f_c$ and $(1+\delta)f_c$, FIG. 10B shows center-spreading where $\Delta f$ is between $(1+\delta)f_c$ and $(1-\delta)f_c$ and FIG. 10C shows down spreading where $\Delta f$ is between $f_c$ and $(1-\delta)f_c$.

Thus, various embodiments of the present invention have been disclosed. Although these embodiments have been described in some detail, it is to be understood that various changes can be made by those skilled in the art without departing from the spirit and scope of the present invention as defined by the appended claims.

The invention claimed is:

1. A spread spectrum clock generator comprising:
a pulse train generator circuit configured to produce a train of pulses;
a modulating circuit configured to produce, for each of the pulse train pulses, a modulating signal relating to a time derivative of the pulse, the modulating circuit including an active differentiator circuit which includes an amplifier, a feedback resistance connected between an output of the amplifier and an inverting input of the amplifier and an input capacitance connected to the inverting input of the amplifier and coupled to receive the pulse train; and a clock generator configured to produce a spread spectrum clock output which is frequency modulated by the modulating signal.

2. The spread spectrum clock generator of claim 1 wherein the modulating circuit includes a passive differentiator circuit that includes resistor-capacitor differentiation circuitry.

3. The spread spectrum clock generator of claim 2, wherein the resistor-capacitor differentiation circuitry includes an input capacitor coupled to receive the pulse train and coupled to a resistor voltage divider coupled to a reference voltage, such that an AC response of the passive differentiator is determined substantially by a capacitance of the capacitor, and a DC component is determined by the voltage reference and the voltage divider.

4. The spread spectrum clock generator of claim 1 further including feedback resistance control circuitry configured to control a magnitude of the feedback resistance in response to the pulse train generator circuit.

5. The spread spectrum clock generator of claim 4 wherein the feedback resistance includes at least two resistors and wherein the feedback resistance control circuitry includes a transistor switch connected across one of the at least two resistors, the transistor switch controlled in response to a level of the pulse train pulses.

6. The spread spectrum clock generator of claim 1 wherein the pulse train generator circuit includes pulse shaping circuitry configured to control at least one of the rise and fall time durations and the pulse magnitude level of the pulse train pulses.

7. The spread spectrum clock generator circuit of claim 6 wherein the pulse shaping circuitry includes a capacitor and first and second current sources configured to respectively charge and discharge the capacitor.

8. The spread spectrum clock generator of claim 7 wherein the first current source operates to begin charging the capacitor in response to a rising edge of a pulse train pulse and wherein the second current source operates to begin discharging the capacitor in response to a falling edge of the pulse.

9. The spread spectrum clock generator of claim 8 wherein the pulse shaping circuitry includes delay circuitry for delaying a time at which the first current source operates to begin charging the capacitor and for delaying a time at which the second current source operates to begin discharging the capacitor.

10. A spread spectrum clock generator comprising:
a pulse train generator circuit configured to generate a train of pulses;
a modulating circuit including an active differentiator circuit comprising an amplifier, a feedback resistance connected between an inverting input of the amplifier and the amplifier output and an input capacitance connected to the inverting input of the amplifier and coupled to receive the pulse train;

the active differentiator circuit configured to produce, for each of the pulses of the pulse train, a modulating signal relating to a time derivative of the pulse; and a voltage controlled oscillator configured to produce a spread spectrum clock output which is frequency modulated by the modulating signal.

11. The spread spectrum clock generator of claim 10, wherein the pulse train generator circuit includes pulse shaping circuitry configured to control at least one of the rise and fall time durations and the pulse magnitude level of the pulse train pulses.

12. The spread spectrum clock generator of claim 10 wherein the pulse shaping circuitry includes a capacitor and first and second current sources configured to respectively charge and discharge the capacitor with the first current source operable to begin charging the capacitor in response to a rising edge of a pulse train pulse and the second current source operable to begin discharging the capacitor in response to a falling edge of the pulse.

13. The spread spectrum clock generator of claim 10 wherein the active differentiator circuit further includes feedback resistance control circuitry configured to control a magnitude of the feedback resistance, the feedback resistance control circuitry including at least two resistors and a transistor switch connected across one of the at least two resistors and controlled in response to a level of the pulse train pulses.

14. A method of generating a spread spectrum clock comprising:
generating a train of pulses;
producing, for each of the pulse train pulses, a modulating signal relating to a time derivative of the pulse train pulses using an active differentiator circuit which includes an amplifier, a feedback resistance and an input capacitance; and
modulating a clock signal with the modulating signal to produce the spread spectrum clock.

15. The method of claim 14 wherein the active differentiator circuit further includes feedback resistance control circuitry configured to control a magnitude of the feedback resistance in response to a level of the pulse train pulses.

16. The method of claim 14 further comprising pulse shaping the pulse train pulses by controlling at least one of the rise and fall time durations and the pulse magnitude level of the pulse train pulses.

17. The method of claim 14 wherein producing the modulating signal is accomplished using a passive differentiator circuit that includes resistor-capacitor differentiation circuitry.

18. The method of claim 17 wherein the resistor-capacitor differentiation circuitry includes an input capacitor coupled to receive the pulse train and coupled to a resistor voltage divider coupled to a reference voltage, such that an AC response of the passive differentiator is determined substantially by a capacitance of the capacitor, and a DC component is determined by the voltage reference and the voltage divider.

* * * * *